United States Patent
Coutelou et al.

(10) Patent No.: US 9,423,435 B2
(45) Date of Patent: Aug. 23, 2016

(54) ELECTRIC POWER METERING DEVICE AND METHOD

(75) Inventors: Olivier Coutelou, Grenoble (FR); Bernard Lebeau, Les Adrets (FR); Marc Paupert, Saint Jean de Vaulx (FR)

(73) Assignee: Schneider Electric Industries SAS, Rueil-Malmaison (FR)

( * ) Notice: Subject to any disclaimer, the term of this patent is extended or adjusted under 35 U.S.C. 154(b) by 1127 days.

(21) Appl. No.: 12/929,375

(22) Filed: Jan. 20, 2011

(65) Prior Publication Data
US 2011/0196629 A1    Aug. 11, 2011

(30) Foreign Application Priority Data
Feb. 8, 2010    (FR) .................................... 10 00504

(51) Int. Cl.
*G01R 31/06*    (2006.01)
*G01R 22/06*    (2006.01)
*G01R 15/26*    (2006.01)
*G01R 19/252*    (2006.01)

(52) U.S. Cl.
CPC .............. *G01R 22/063* (2013.01); *G01R 15/26* (2013.01); *G01R 19/252* (2013.01)

(58) Field of Classification Search
USPC .................. 324/126, 127, 119, 120, 134, 111; 340/870.02
See application file for complete search history.

(56) References Cited

U.S. PATENT DOCUMENTS

| | | | |
|---|---|---|---|
| 3,460,042 A | 8/1969 | Harner | 325/67 |
| 5,687,066 A * | 11/1997 | Cook, II | 363/89 |
| 7,359,809 B2 * | 4/2008 | Bruno | 702/64 |
| 2005/0267698 A1* | 12/2005 | Gordon | 702/64 |
| 2007/0030616 A1* | 2/2007 | Houbre | 361/115 |
| 2008/0125986 A1* | 5/2008 | Slota et al. | 702/61 |
| 2009/0309754 A1 | 12/2009 | Bou et al. | 340/870.02 |
| 2011/0248730 A1* | 10/2011 | Adam | G01R 15/04 324/691 |
| 2011/0304321 A1* | 12/2011 | Bruel | G01R 22/063 324/140 R |

FOREIGN PATENT DOCUMENTS

| | | |
|---|---|---|
| EP | 2 048 482 | 4/2009 |
| WO | WO2008/142429 | 11/2008 |

OTHER PUBLICATIONS

Patent Abstracts of Japan—Current Detecting Method JP56-063264, retrieved May 18, 2014.*

* cited by examiner

*Primary Examiner* — Jermele M Hollington
(74) *Attorney, Agent, or Firm* — Steptoe & Johnson LLP (57) ABSTRACT

An electric power metering device which includes a current sensor, an electronic measurement and rectifier circuit, a processing circuit and a transmitter connected to the processing circuit to transmit power messages to an electric power measurement receiver. An electric current integration capacitor is connected to the current sensor via a rectifier circuit. A switch is commanded by a threshold detector to supply to the processing circuit and the transmitter power accumulated in the capacitor when its electric voltage has exceeded a predefined voltage threshold. A power message representative of a quantity of electric power is then transmitted. A power metering method includes transmission of a power message when a capacitor voltage has reached a voltage threshold.

16 Claims, 6 Drawing Sheets

ELECTRIC POWER METERING DEVICE AND METHOD

BACKGROUND OF THE INVENTION

The invention relates to an electric power metering device comprising:
- at least one current sensor to supply a secondary measurement current representative of a primary current flowing in a primary electric conductor,
- an electronic measurement and rectifier circuit connected to said at least one current sensor,
- a processing circuit connected to the electronic measurement and rectifier circuit, and
- a transmitter connected to the processing circuit to transmit messages over a wireless communication network to an electric power measurement receiver.

The invention also relates to an electric power metering method.

STATE OF THE ART

Electronic devices for metering electric power with remote elements are arranged on electric line conductors to estimate or measure current, power and/or electricity. Systems called wireless systems generally have a first part on the electric conductor with a radio transmitter and a second centralizing part with a radio receiver and centralized power and electricity processing.

Patent application WO2008142429 shows a first known example of a device. The voltage of the mains power system is measured locally with a capacitive divider. Power supply of the electronic circuitry is essentially based on the presence of a battery.

The document EP2048482 describes an electronic circuitry power supply with multiple sources and a battery.

State-of-the-art devices are generally dependent on an external power supply or on the presence of a battery cell or a rechargeable battery. They therefore have a relative autonomy and are not able to be operational at all times.

SUMMARY OF THE INVENTION

The object of the invention is to provide a device and a method for metering electric power enabling the use of an external power source, battery cells or rechargeable batteries to be avoided.

A device for metering electric power according to the invention comprises:
- an electric current integration capacitor connected to said at least one current sensor via current rectifier means,
- voltage threshold detection means connected to said integration capacitor to detect an overshoot of a predefined voltage threshold on said integration capacitor,
- switch means controlled by said threshold detection means to trigger electric power supply of said processing circuit and of said transmitter with a power accumulated on the integration capacitor when an electric voltage on said integration capacitor has exceeded said predefined voltage threshold, said processing circuit and said transmitter then transmitting a power message of a quantity of electric power or of a quantity of electric current that has flown in said primary electric conductor.

Said switch means are preferably composed of a component of thyristor type stopping turn-on below a holding current, and said detection means are in a voltage reference component with low leakage current on input.

In a preferred embodiment, the device comprises discharging means to discharge said integration capacitor at the end of the transmission cycle.

Said power messages transmitted by the transmitter advantageously contain pulse count data.

Said power messages transmitted by the transmitter preferably contain power metering or current quantity metering data.

In a particular embodiment, the device comprises means for detecting zero crossing of the current, said power message being transmitted when a zero crossing is detected.

The processing circuit advantageously comprises correction means to locally correct power data values according to parameters which are either pre-loaded or sent by previous return messages.

The device advantageously comprises means for computing a rms value of said primary current arranged in processing circuit and/or in a processing module of a receiver.

A method for metering electric power according to the invention comprises:
- charging an integration capacitor with a secondary current representative of a current flowing in an electric conductor,
- actuating turn-on of a switch when the voltage of said integration capacitor exceeds a predefined threshold,
- supplying the processing circuit with a charging voltage of said integration capacitor via said switch,
- preparing and transmitting a power message representative of a quantity of electric power or of a quantity of electric current that has flown in said primary electric conductor,
- commanding full discharge of the capacitor, and
- stopping turn-on of said switch.

The metering method advantageously comprises:
- receipt of said message representative of a quantity of electric power by a receiver, and
- incrementation of an electric power meter.

The metering method advantageously comprises:
- receipt of a return message from a receiver comprising correction and parameter setting values, and
- preparing and transmitting said power message representative of a quantity of electric power with complete electric power value data.

In a particular embodiment, the metering method comprises:
- waiting for a zero crossing of said secondary current to transmit said message representative of a quantity of electric power,
- detection of a zero crossing moment of an electric voltage by a receiver, and
- determination by said receiver of a value representative of a phase difference between a voltage and a current according to the zero crossing moment of said voltage electric and of the moment of receipt of said power message.

Transmission of the power messages is advantageously performed when a predefined number of charging and discharging cycles of said capacitor is performed, the electric power value to be transmitted depending on said predefined number of cycles.

The metering method preferably comprises correction of values or quantities of electric power to correct a non-linearity of said current sensor over the operating range, errors due to component leakage current and/or errors due to processing and transmission times.

The metering method preferably comprises transmission of a return message from a power message receiver, said return message comprising data representative of a phase difference between a voltage and a current, of an electric voltage value, of a number of charging-discharging cycles before message transmission, of correction parameters and/or a corrected electric power value.

BRIEF DESCRIPTION OF THE DRAWINGS

Other advantages and features will become more clearly apparent from the following description of particular embodiments of the invention, given for non-restrictive example purposes only and represented in the accompanying drawings in which.

DETAILED DESCRIPTION OF PREFERRED EMBODIMENTS

Figure 1:
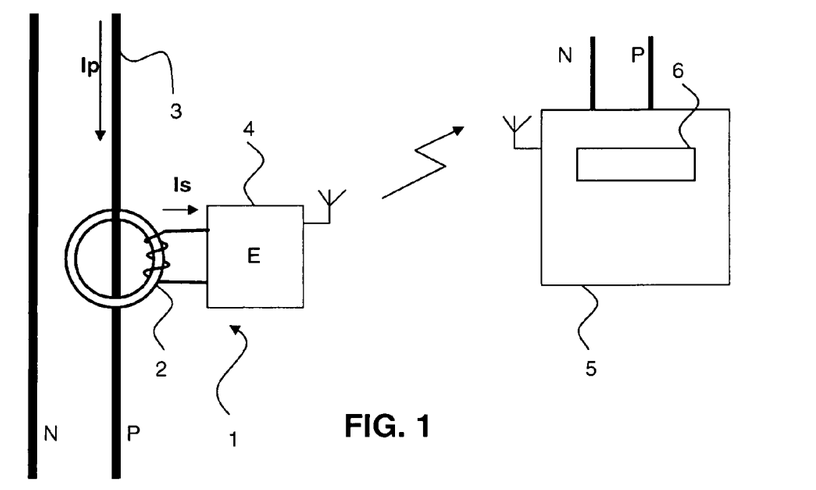
FIG. 1 represents an electric power metering device with a wireless link according to an embodiment of the invention.

FIG. 1 represents an electric power metering device with a wireless link to transmit pulses representative of a predefined quantity of electric power. The device comprises a transmitter part 1 with a current sensor 2 to supply a secondary measurement current Is representative of a primary current Ip flowing in a primary electric conductor 3. The current Is is processed by an electronic module 4 to transmit radio messages representative of a quantity of electric power. The electric power is achieved by integration of the current, it being known that the voltage of the mains system is estimated or measured elsewhere by other means. When a quantity of power is reached, a pulse in the form of a message is sent to a remote receiver 5. The receiver receives the messages and processes the power data in particular by storage and display of the values on a screen 6.

Figure 2:
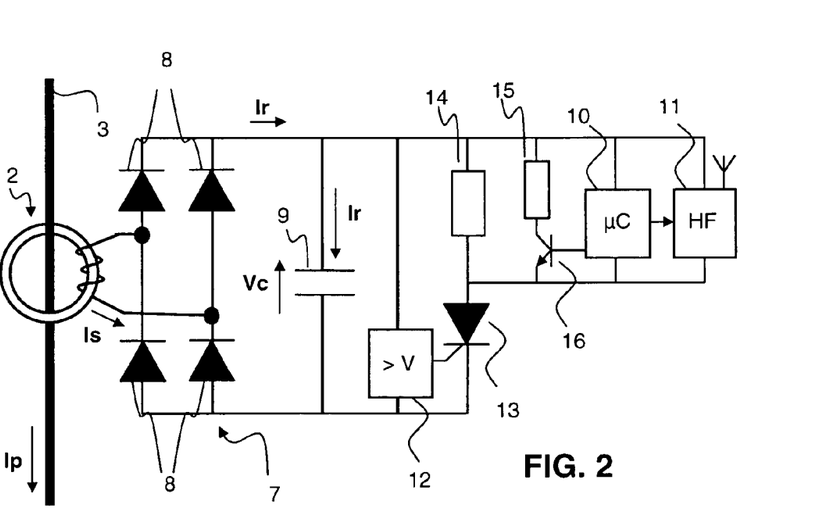
FIG. 2 represents a diagram of a device according to a first embodiment of the invention.

FIG. 2 represents a diagram of a device according to a first embodiment of the invention. The current sensor 2 supplies the secondary measurement current Is representative of the primary current Ip to an electronic measurement and rectifier circuit. The sensor is in this way connected to a rectifier bridge 7 with four diodes 8. On output of the rectifier bridge, a rectified current Ir is applied to an integration capacitor 9 of the current Ir. In this case, the electric current integration capacitor is connected to the current sensor via current rectifier means. A voltage Vc at the terminals of the capacitor is representative of integration of the current in time and consequently of an electric power, since the mains system voltage V is known and constant as is the phase difference and power factor. This device also comprises a processing circuit connected to the electronic measurement and rectifier circuit and a transmitter connected to the processing circuit 10 to transmit messages over a wireless communication network to the electric power measurement receiver 5. The device operates in two stages. In a first stage, integration or accumulation of the current Ir takes place in the capacitor 9 to give a voltage representative of an electric power quantity. Then in a second stage, transmission of a message is triggered when the quantity of power reaches a predefined level.

In this embodiment of the invention the device comprises a voltage threshold detector 12 connected to the capacitor 9 to detect overshoot of a predefined voltage on the integration capacitor 9. A switch 13 commanded by the threshold detector 12 triggers electric power supply of the processing circuit 10 and of the transmitter 11 with the power accumulated in the capacitor when the electric voltage on the integration capacitor has exceeded said predefined voltage threshold. At this moment, the processing circuit 10 and transmitter 11 transmit a power message representative of a quantity of electric power or of integration of current that has flown in said primary electric conductor. The switch 13 is advantageously a component of thyristor type stopping turn-on automatically below a holding current. This component of thyristor type can also be replaced by assemblies with transistors having similar characteristics with control by input or trigger electrode and stopping turn-on by reduction of the through current. The voltage threshold detector 12 is preferably a voltage reference component with low leakage current in order to limit current leakage during charging of the capacitor. A resistor 14 in parallel with the power supply of the circuits 10 and 11 enables a minimum current to be made to flow to guarantee turn-on of said thyristor 13.

In the second stage of operation, processing and transmission of a message has to be performed quickly. The time taken by this process must be much shorter than the capacitor charging time and is preferably known and calibrated. At the end of this second time, discharging of the capacitor has to be fast to restart a new cycle. The device therefore comprises a high-speed discharge circuit to empty the charge of the capacitor at the end of a transmission cycle. This high-speed discharge circuit comprises a resistor 15 of low value in series with a transistor 16 controlled by the processing circuit 10 at the end of cycle. When the capacitor is discharged, the thyristor current becomes low or close to zero and the thyristor then turns off naturally. The electronic circuitry downline from the capacitor 9 is no longer supplied and charging of the capacitor 9 can restart.

The power on resistive charging without phase difference can be expressed by an integral of a product between a voltage V and a current I.

$$E=\int V(t)I(t)dt$$

Since the voltage is assumed to be constant at least during a time interval between two messages, the power can be expressed in the following manner:

$$E=V\int I(t)dt$$

The power E and voltage V are determined in a receiver, consequently a part called transmitter will supply the integration of I:

$$\int I(t)dt$$

where dt is determined by a time interval between two messages. The voltage Vc on the integration capacitor is representative of the current integral. When a message is transmitted, it is therefore representative of a quantity of power. This value can also be used to determine a mean value of the primary current.

The integration of I is also representative of a quantity of electric current that has flown in said primary electric conductor Ip. Computing means can thus be arranged in the processing circuit 10 and/or in a processing module of a receiver to compute a mean value of said primary current Ip.

Figure 3:
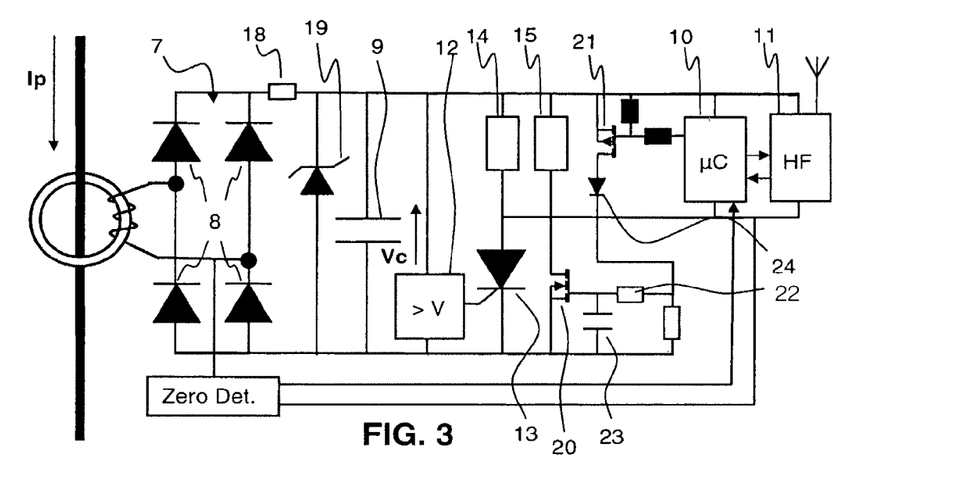
FIG. 3 represents a diagram of a device according to a second embodiment of the invention.

FIG. 3 represents a diagram of a device according to a second embodiment of the invention. In this embodiment, the processing circuit 10 and transmitter 11 can operate in bidirectional manner. The device also comprises a current zero crossing detector 17 connected for example between an input of the rectifier bridge 7 and an input of the processing circuit 10. In this case, transmission of said power message is delayed until a zero crossing is detected. This wait will allow a receiver to calculate a time delay between a zero crossing of an AC voltage of the mains system and zero crossing of the current represented by receipt of said power message. The time between the zero crossings is used in particular for calculating a phase difference $\phi$ between the current and voltage and/or a power factor or the cosine $\phi$ of an installation.

FIG. 3 also shows a protection circuit composed of a resistor 18 and diode 19 for voltage surge protection. This circuit prevents disturbances which propagate on the mains system conductor 3 from disturbing operation of the device. Resistor 18 is of low value in order not to disturb the global impedance of the circuit and diode 19 is chosen from diodes having a very weak leakage current to prevent any shunting of current Ir during charging of the capacitor 9. In this diagram, the high-speed discharge circuit comprises a resistor 15 and transistor 20 connected directly in parallel on capacitor 9 to empty the capacitor completely without having to withstand a direct voltage from the thyristor or stopping conduction thereof at weak current. To be compatible with different reference lines, a transistor 21 referenced to a positive line commands the transistor 20 via a reverse-blocking diode 24. A delay circuit composed of a resistor 22 and capacitor 23 continues to command the discharge transistor 20 for a short time even if the circuit 10 is no longer supplied.

Figure 4A:
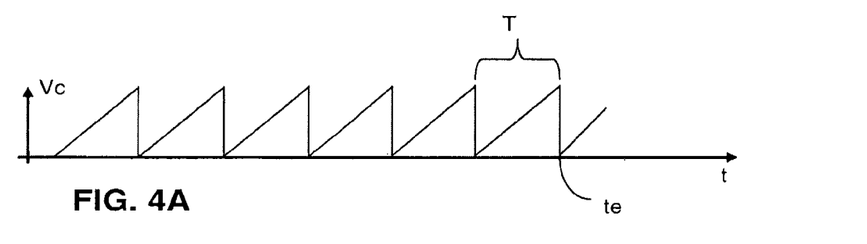
FIGS. 4A and 4B represent timing diagrams of chargings and dischargings of capacitors in devices according to embodiments of the invention.
Figure 4B:
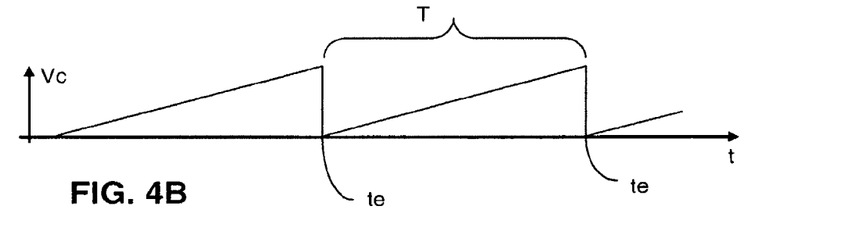

FIGS. 4A and 4B represent timing diagrams of chargings and dischargings of capacitor 9 in devices according to embodiments of the invention. In FIG. 4A, the current is high and a charging and discharging period T is short. In FIG. 4B, the current is weaker and the period T is longer. A message representative of a power unit is sent at times te. These messages can be sent at each end of charging of the capacitor or according to a predefined number N of chargings to prevent a too large number of messages when the current is strong and capacitor chargings are very frequent. Reducing the number of messages also reduces the density of messages in the communication network.

Figure 5A:
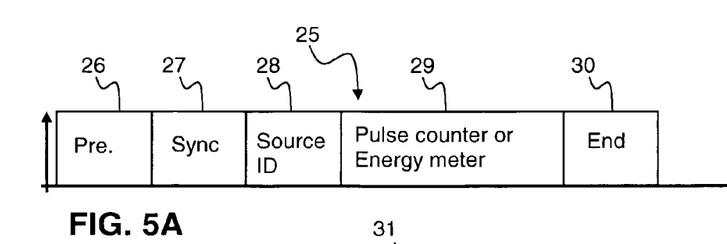
FIGS. 5A and 5B represent contents of messages transmitted in devices according to embodiments of the invention.

FIGS. 5A and 5B represent contents of messages transmitted and/or received in devices according to embodiments of the invention. In FIG. 5A, a first transmitted message 25 contains a preamble 26, synchronisation data 27, an identifier 28 of the transmitter and/or source, data 29 representative of the power, and end-of-transmission or control data 30. Data 29 can be a fixed value associated in particular with pulse count data, a variable value incremented at each pulse or transmission, a variable value associated with a number N of charging cycles, or a cumulated electric power value. The power messages transmitted by the transmitter thus comprise pulse count data and/or power metering data.

Figure 5B:
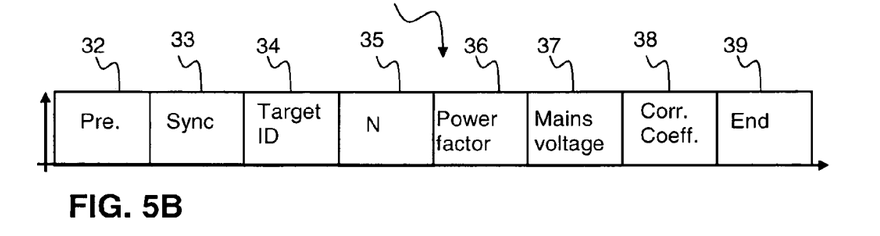

In FIG. 5B, a second message 31 is received on return from a receiver. Such a message is used in particular for setting the parameters of the processing circuit and of the transmitter. The return message 31 contains a preamble 32, synchronisation data 33, an identifier 34 of the target or receiver, data 35 for the number N of waits for charging between transmissions, a phase difference or a power factor 36 determined by the receiver, a mains system voltage value 37, one or more power corrector coefficients 38, and/or end-of-transmission or control data 39. In this case, the processing circuit comprises correction means to correct power data values locally according to parameters which are pre-loaded or sent by previous return messages.

Figure 6A:
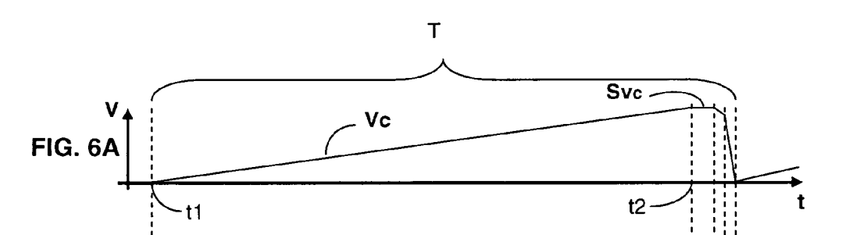
FIGS. 6A to 6D illustrate a first operation of a device according to an embodiment of the invention.
Figure 6B:
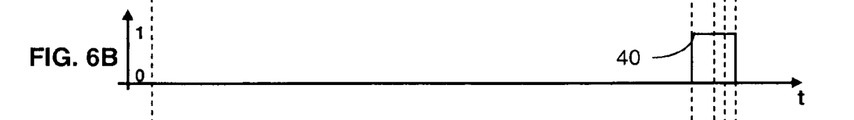
Figure 6C:
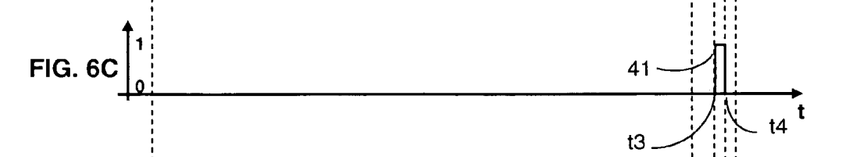
Figure 6D:
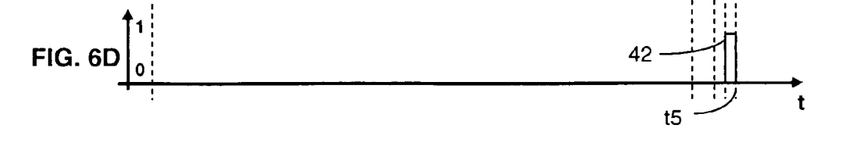

FIGS. 6A to 6D illustrate a first operation of a device according to an embodiment of the invention. In FIG. 6A, a plot Vc represents the charging voltage of capacitor 9. At the time t1, the capacitor starts to charge with the rectified current Ir from the sensor, then at the time t2 a charging threshold Svc is reached. The switch 13 turns on, represented by a status curve 40 of FIG. 6B, and commands supply of the processing and transmission circuits. In FIG. 6C, a plot 41 shows transmission of a power message between the times t3 and t4. Then a plot 42 of 6D shows command of capacitor discharging between the time t4 and a full discharge time t5.

Figure 7A:
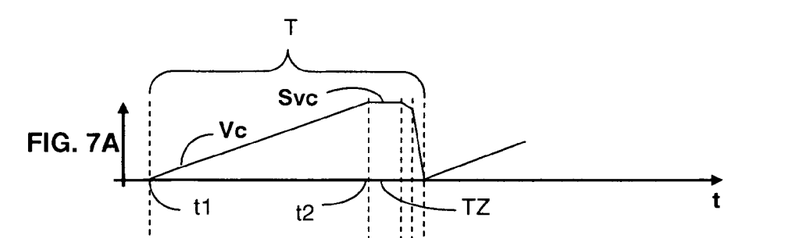
FIGS. 7A to 7C illustrate a second operation of a device according to an embodiment of the invention.
Figure 7B:
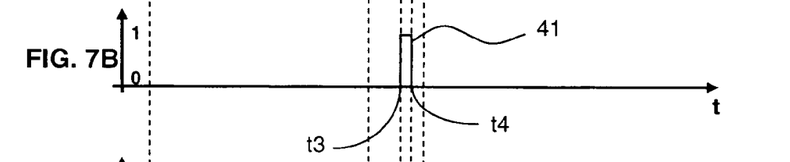
Figure 7C:
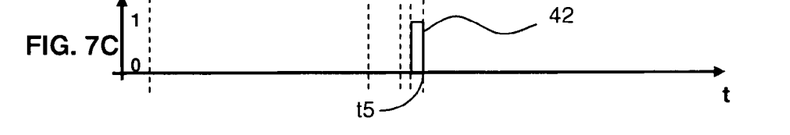

FIGS. 7A, 7B and 7C respectively illustrate the charging voltage plot Vc of capacitor 9, message transmission plot 41, and discharge command plot 42 of capacitor 9. After the threshold overshoot and circuitry supply command time t2, the processing circuit waits for a next zero crossing to trigger transmission of a power message. In FIG. 7A, waiting takes place for a period Tz. Such a delay enables message transmission to be synchronized with a zero crossing thereby enabling a receiver to calculate a stagger between a mains voltage zero crossing and a current. Such a time stagger between the current and voltage can be used to calculate a phase difference and a power factor.

Figure 8:
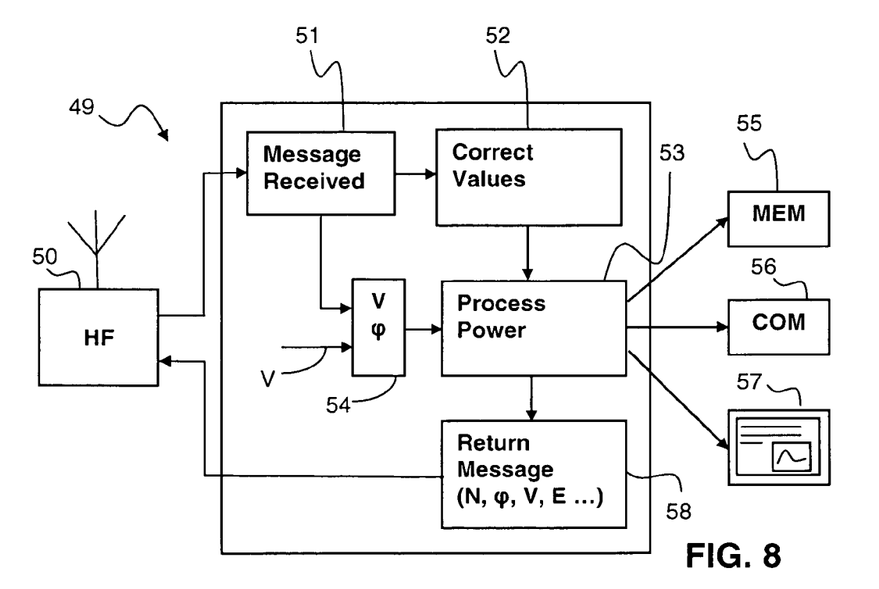
FIG. 8 represents a block diagram of a message receiver according to a device of an embodiment of the invention.

FIG. 8 represents a block diagram of a message receiver according to a device according to an embodiment of the invention. The messages are received by a receiver 50 and a processing module 51 of the received messages. A module 52 connected to module 51 performs correction of the received power values. Power measurement errors can be due to non-linearities of the sensor at low current level because of magnetization of the magnetic circuit, of current leaks in the components, at high level because of saturation of the magnetic circuit, and/or to the processing and transmission and discharging time when for high currents this time is no longer negligible compared with the charging time of the capacitor 9. These errors are known or measurable when parameter setting is performed, and they can then be corrected in receivers by correction coefficients or tables in a module 52. A module 53 processes the power values performing intermediate calculations of the cumulated values or by power extraction. Depending on the messages, it increments an electric power meter. A module 54 receives a voltage signal V and synchronization of the arrival of a message from module 51. It determines the value of voltage V for calculation of the electric energy and power, and a stagger between a zero crossing of voltage V and the message receipt signal representative of a zero crossing of current Is. This stagger will be used to determine a phase difference between the voltage and current and a power factor. These values are provided to module 53 which completes the active or reactive power calculations. Module 53 can store the power values in a data storage module 55, communicate them via a communication circuit 56, or display them on a screen 57. A module 58 prepares a return signal for certain transmitters for the purpose of tuning or modifying the parameter settings. The return messages in particular comprise values of a new power unit, phase difference or power factor values, voltage values in the case where the power unit can be calculated locally by the transmitter, and/or values of number N to determine the number of chargings and dischargings before transmission of a signal.

Figure 9:
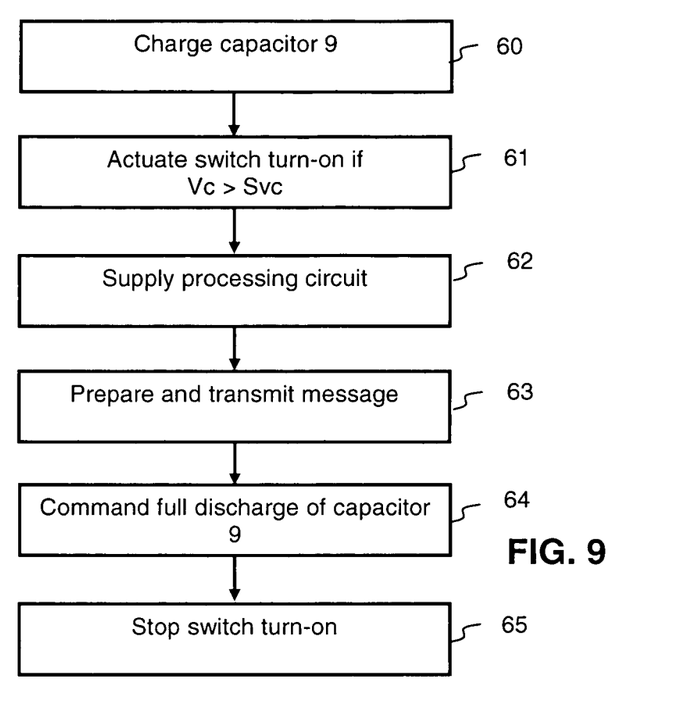
FIGS. 9 and 10 represent a first flowchart of a method according to an embodiment of the invention.
Figure 10:
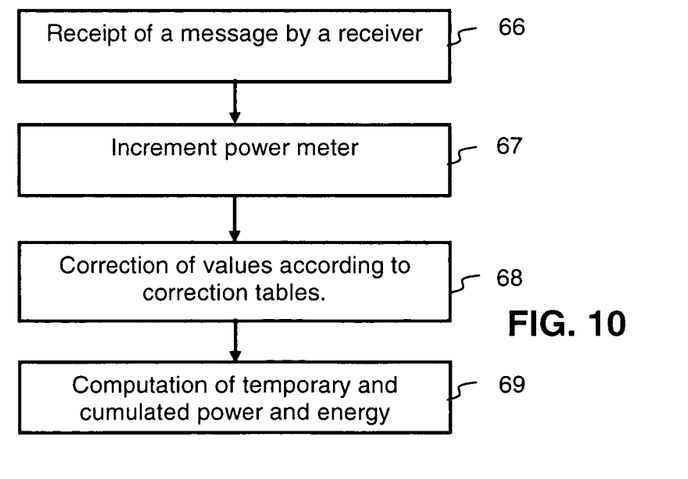

FIGS. 9 and 10 represent a first flowchart of a method according to an embodiment of the invention. Charging of capacitor 9 with a secondary current representative of a current flowing in an electric conductor is performed in a step 60. When the voltage of the capacitor exceeds a predefined threshold Svc, turn-on of a switch is actuated in a step 61. Supply of a processing circuit by charging of the capacitor via said switch is performed in step 62. Then in a step 63, preparation and transmission of a power message representative of a quantity of electric power or of an integration of current that has flown in said primary electric conductor is performed. Then, at the end of message transmission, a step 64 commands full discharge of the capacitor and a step 65 commands stopping of turn-on of said switch.

In FIG. 10, a step 66 involves receipt of said message representative of a quantity of electric power by a receiver. In the receiver, a step 67 performs incrementation of an electric power meter. In a step 68, correction is performed of values or quantities of electric power to correct a non-linearity of said current sensor over the operating range, of errors due to component leakage currents and/or of errors due to processing and transmission times. A step 69 calculates power values or temporary or cumulated energy values.

Figure 11:
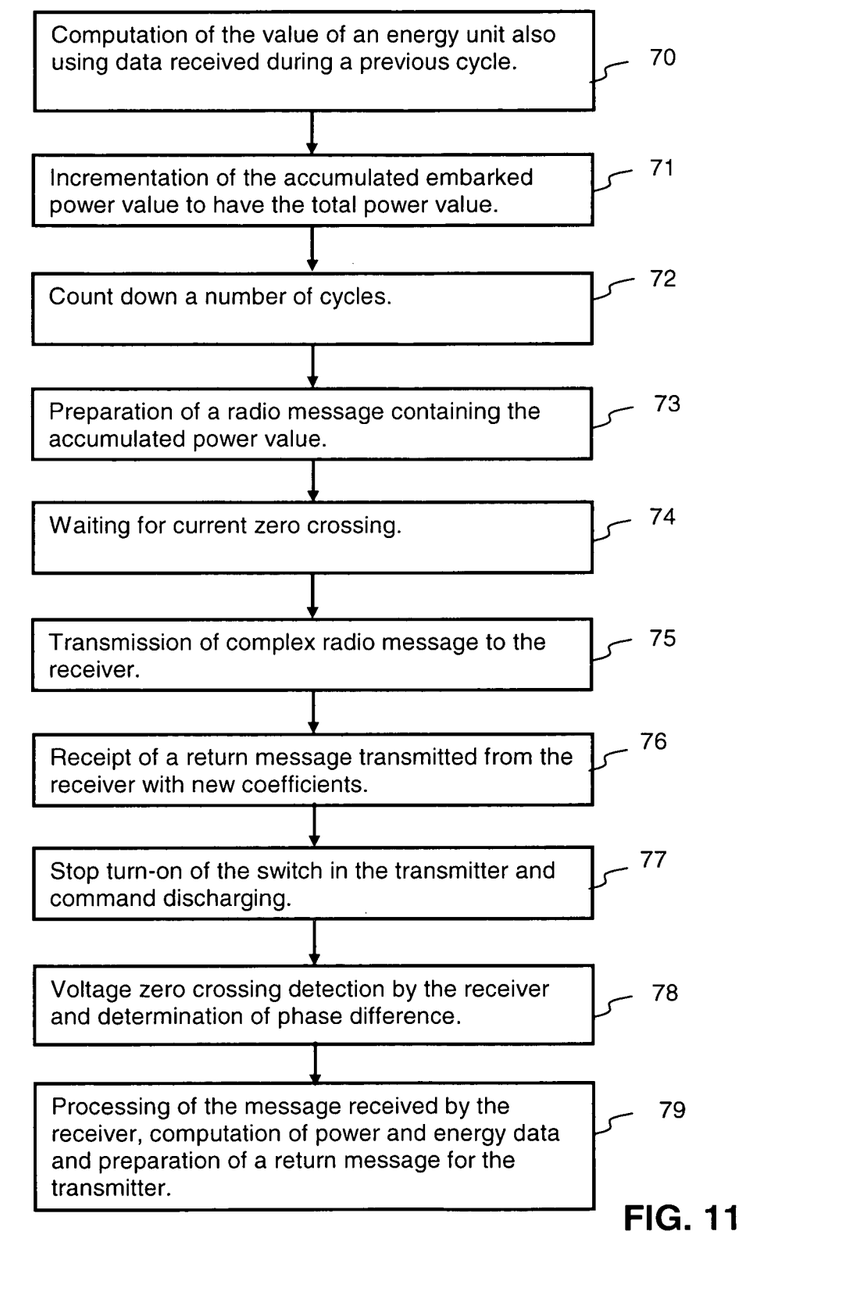
FIG. 11 represents a second flowchart of a method according to an embodiment of the invention.

FIG. 11 represents a second flowchart of a method according to an embodiment of the invention. The steps of this method are additional to or integrated in steps of the flowcharts of FIGS. 9 and 10. In a step 70, as soon as the voltage threshold is exceeded and the processing circuit is supplied, calculation of a power unit is performed according to a constant dependent on the capacitor charging cycle and on data received during a previous cycle. This data is in particular the value of the electric voltage of the mains system, the value of the phase difference or of the power factor between the electric current and voltage, or an electric power unit value. In a step 71, an accumulated power value is incremented with the new value calculated in step 70 to have a total power value. A step 72 waits for or counts a predefined number N of charging and discharging cycles of said capacitor 9 before transmitting power messages. The electric power quantity is then proportional to said predefined number of cycles or cumulated during this number of cycles if the values are complex and different at each cycle. In a step 73, a message representative of a quantity of electric power is prepared with complete electric power value data. Waiting for a zero crossing of said secondary current to transmit said message representative of a quantity of electric power is performed in a step 74. This waiting enables a receiver to calculate staggers of zero crossings between the current and the voltage of a mains power system on receipt of a message. Thus, in a step 75, a complex message is transmitted able to contain an instantaneous or temporary power value, a value of cumulated power between two transmissions or a total power value. After transmission of a power message, in a step 76, receipt of a return message from a receiver comprising correction and parameter setting values takes place. This return message is prepared in advance by a receiver which sends it back in reflex manner after receipt of a power message. A step 77 indicates end of turn-on of the switch and of command of full discharging of capacitor 9.

In a receiver, there is a step 78 for detection of a zero crossing time of a mains system electric voltage. Then a value representative of a phase difference between a voltage and a current according to the zero crossing time of said electric voltage and to the time of receipt of said power message is determined by said receiver. In a step 79, the received power message is processed to compute electric energy, power, or mean current value data. This data can for example be stored, communicated, displayed, or processed for other electric power management functions. In 79, the return message is prepared to be sent back in response to a subsequent power message receipt. The return message received in step 76 and transmitted from a receiver for example contains data representative of a phase difference between a voltage and a current, an electric voltage value, a number N of charging-discharging cycles before message transmission, correction parameters and/or a corrected electric power value.

The links between the transmitters described in the foregoing are preferably wireless radio links in which the radio transmitters are self-powered. These links can also be optic in particular with infrared transmitters and receivers. The messages can also be sent over a hardwired link in which the transmitter is self-powered by the current sensor.

The wireless radio link used between the transmitter and receiver is preferably achieved according to the technology called "ZigBee" from the "ZigBee Alliance" association. The current sensor 2 is preferably a current transformer of closed coil or opening magnetic circuit type for easy installation on electric conductors. The capacitor 9 is advantageously of very high value for example between 500 and 1000 microfarads with a very low leakage current. The voltage threshold detection circuit 12 is a circuit with a very low leakage current, its voltage threshold is preferably between 3 and 5 volts to have a small load on the sensor. The diodes 8 are preferably Schottky diodes with low DC voltage.

The power messages sent by the device can be of several types: they can in particular comprise simple identifiers, and/or identifiers with counters which increment on each message transmission, and/or messages with a unit power value, and/or messages with a locally corrected power value, and/or messages with cumulated power values.

The invention claimed is:

1. An electric power metering device, operable in first and second operating stages for measuring a primary current, or power in a primary electric conductor, said device comprising:
   at least one current sensor for supplying a secondary measurement current representative of a primary current flowing in a primary electric conductor,
   an electronic measurement circuit and rectifier bridge, connected to said at least one current sensor for providing said secondary measurement current to the rectifier bridge, said rectifier bridge for converting the secondary measurement current to a rectified current;
   a processing circuit connected to the electronic measurement circuit and rectifier bridge;
   a transmitter connected to the processing circuit for transmitting messages over a wireless communication network to an electric power measurement receiver;
   an electric current integration capacitor connected to said at least one current sensor via the rectifier bridge, said electric current integration capacitor for, during a first operating stage of the device, integrating and accumulating the rectified current applied to the electric current integration capacitor from the rectifier bridge, to produce an electric voltage representative of the integration of the rectified current or electric power accumulated in the electric current integration capacitor;
   voltage threshold detection means connected to said integration capacitor for detecting overshoot of a predefined voltage threshold of said integration capacitor, said predefined voltage threshold being an amount of electric voltage representative of the integration of the rectified current or the electric power accumulated in the electric current integration capacitor, as determined during the first operating stage;

switch means commanded by said threshold detection means, and for, during a second operating stage when the electric voltage on said electric current integration capacitor exceeds the predefined voltage threshold, supplying electric power accumulated in the electric current integration capacitor to said processing circuit and said transmitter, said processing circuit and said transmitter for then transmitting a power message representative of an amount of electric power or of electric current that has flowed in said primary electric conductor; and discharging means for discharging the electric current integration capacitor when the power message has been transmitted by said processing circuit, said transmitter thereby ending the second operating stage.

2. The device according to claim 1 wherein said switch means comprises a thyristor which closes when a supplied current is below a holding current, and the voltage threshold detection means comprises a voltage reference component with low leakage current on input.

3. The device according to claim 1 wherein said power messages transmitted by the transmitter contain pulse count data.

4. The device according to claim 1 wherein said power messages transmitted by the transmitter contain power metering data or current quantity metering data.

5. The device according to claim 1 comprising current zero crossing detection means, said power message being transmitted when a zero crossing is detected.

6. The device according to claim 1 wherein the processing circuit comprises correction means for locally correcting values of the power data according to parameters that are either preloaded or sent by previous return messages.

7. The device according to claim 1 additionally comprising means for calculating a mean value of said primary current, and arranged in said processing circuit and/or in a processing module of a receiver.

8. An electric power metering method for measuring current or power in an electric conductor, said method comprising:

charging, via a rectifier bridge, an integration capacitor with a secondary current representative of a current flowing in the electric conductor, by applying the secondary current to the rectifier bridge which converts the secondary current to a rectified current, and during a first transmission stage, applying the rectified current from the rectifier bridge to the integration capacitor thereby integrating and accumulating in the integration capacitor to produce an electric voltage representative of the accumulated, integrated, rectified current or electric power in the integration capacitor;

closing a switch when the voltage of said integration capacitor exceeds a predefined threshold, said voltage threshold being a predetermined amount of voltage representative of the integration of the rectified current or the electric power accumulated in the integration capacitor, as determined during the first transmission stage;

during a second transmission stage, supplying electric power accumulated in the integration capacitor to a processing circuit and a transmitter via said switch, when the electric voltage of said integration capacitor exceeds the predefined voltage threshold;

transmitting, during the second transmission stage, a power message representative of an amount of electric power or of an amount of electric current that has flowed in said electric conductor, commanding full discharge of the capacitor thereby ending the second transmission stage, and opening said switch.

9. The metering method according to claim 8 additionally comprising:

receiving said message representative of a quantity of electric power, and incrementing an electric power meter.

10. The metering method according to claim 8 additionally comprising:

receiving a return message from a receiver, the return message comprising correction and parameter setting values, and transmitting said power message representative of a quantity of electric power, with complete electric power value data.

11. The metering method according to claim 8 comprising:

waiting for a zero crossing of said secondary current to transmit said message representative of a quantity of electric power, detection of a zero crossing moment of an voltage electric by a receiver, and determination by said receiver of a value representative of a phase difference between a voltage and a current according to the zero crossing moment of said electric voltage and to the receipt time of said power message.

12. The metering method according to claim 8 including transmitting the power messages when a predefined number of charging and discharging cycles of said capacitor have been performed, the electric power value to be transmitted depending on said predefined number of cycles.

13. The metering method according to claim 8 additionally comprising correcting values or of quantities of electric power to correct a non-linearity of said current sensor over an operating range, due to component leakage currents and/or processing and transmission times.

14. The metering method according to claim 8 additionally comprising transmitting a return message from a power message receiver, said return message comprising data selected from the group consisting of data representative of: a phase difference between a voltage and a current, an electric voltage value, a number of charging-discharging cycles before message transmission, correction parameters, and a corrected electric power value.

15. The device according to claim 1, wherein the rectifier bridge has output terminals across which a voltage surge protection circuit is connected, said protection circuit comprising a resistor in series with a diode, and said protection circuit is connected to at least one current sensor via the rectifier bridge.

16. The metering method according to claim 8, additionally comprising providing voltage surge protection to the integration capacitor, processing circuit and switch, using a resistor in series with a diode connected across output terminals of the rectifier bridge.

* * * * *